United States Patent [19]

Robinson

[11] 4,394,236

[45] Jul. 19, 1983

[54] MAGNETRON CATHODE SPUTTERING APPARATUS

[75] Inventor: Merrill G. Robinson, Ann Arbor, Mich.

[73] Assignee: Shatterproof Glass Corporation, Detroit, Mich.

[21] Appl. No.: 348,804

[22] Filed: Feb. 16, 1982

[51] Int. Cl.³ .............................................. C23C 15/00
[52] U.S. Cl. ............................... 204/192 R; 204/298
[58] Field of Search ............................ 204/192 R, 298

[56] References Cited

U.S. PATENT DOCUMENTS 3,898,952  8/1975  Shirahata et al. ............. 118/719
4,356,073 10/1982  McKelvey ................... 204/192 R

FOREIGN PATENT DOCUMENTS 2707144  8/1977  Fed. Rep. of Germany ...... 204/298
51-17272  2/1976  Japan ........................... 204/192 R Primary Examiner—Aaron Weisstuch
Attorney, Agent, or Firm—William E. Nobbe

[57] ABSTRACT

A magnetron cathode sputtering apparatus for operation within an evacuable chamber for coating planar substrates, such as glass sheets, that are also contained in said chamber. The cathode comprises an elongated substantially U-shaped support member mounted in said chamber and provided with a concavo-convex bottom wall. Magnetic means is mounted within the support member and includes an array of permanent magnets extending lengthwise thereof to provide a magnetic field which establishes the zone or region in which sputtering of the target material takes place. The target comprises a replaceable continuous band or foil of the material to be sputtered. The foil is mounted on a feed roll at one side of the cathode and is advanced across said support member in contact with the convex surface of the bottom wall thereof for sputtering as it passes through the sputter zone, and subsequently wound onto a take-up roll at the opposite side of said cathode. Planar substrates, transported relative to the target foil, are sputter coated as they pass through the sputter zone.

8 Claims, 6 Drawing Figures

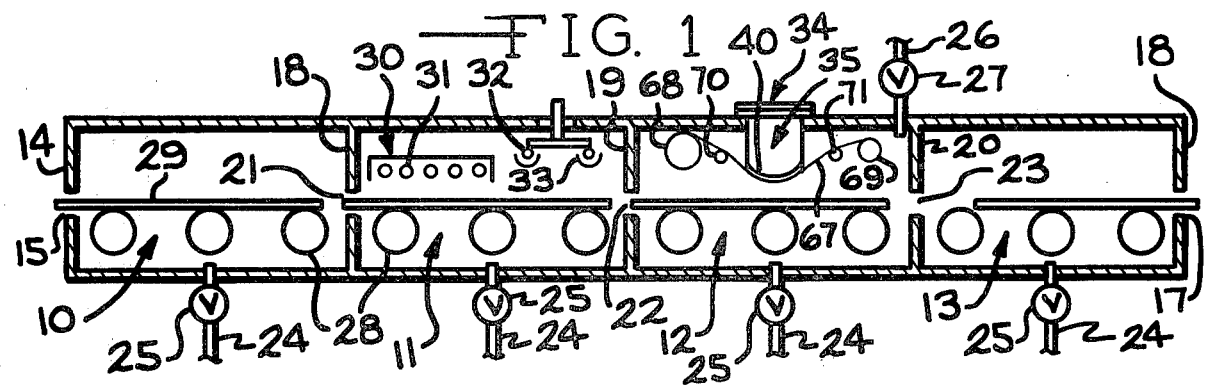
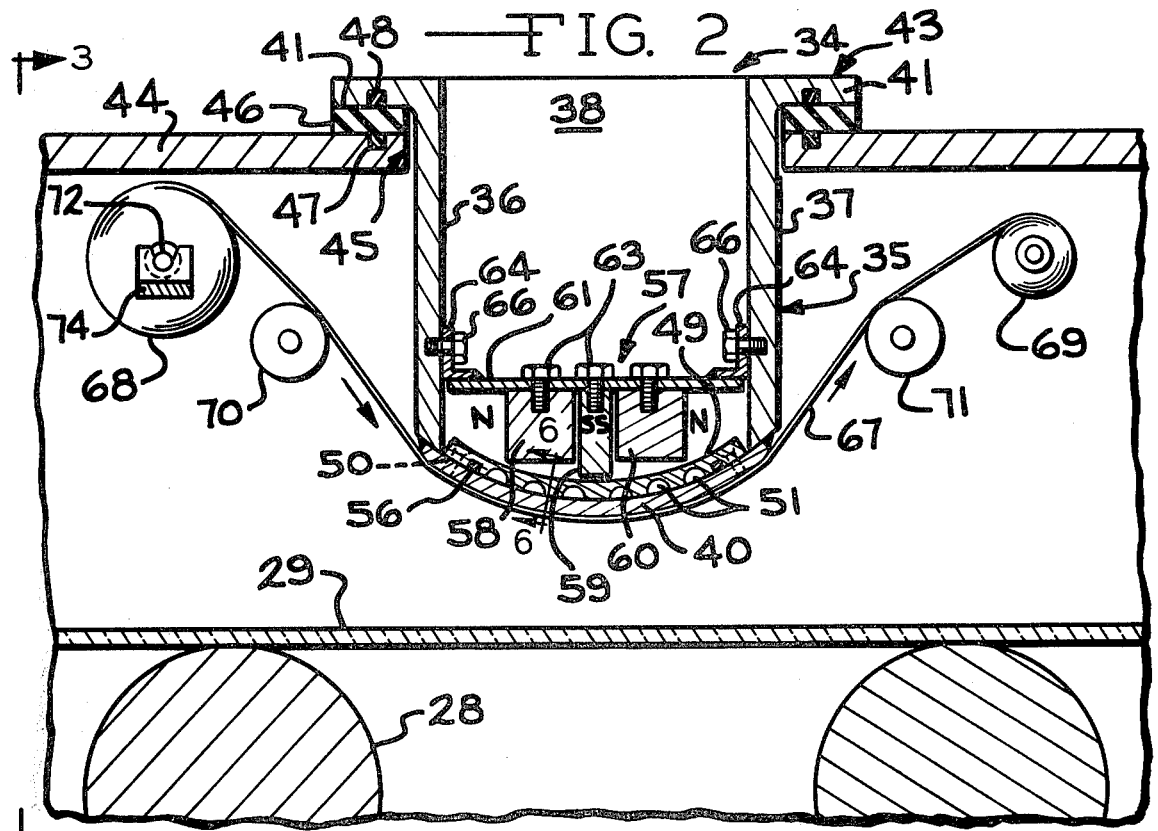
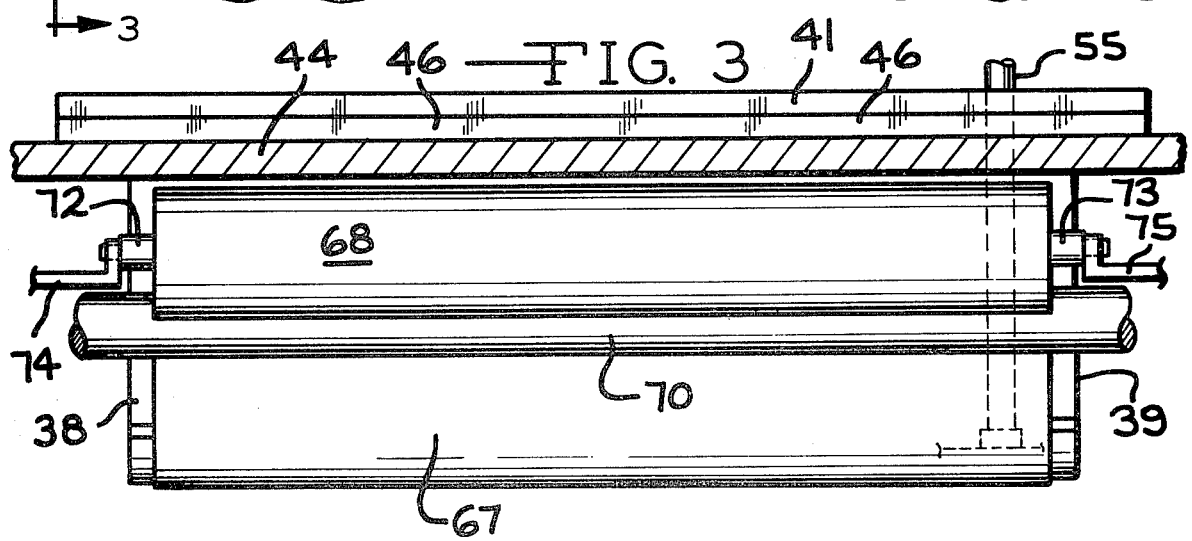

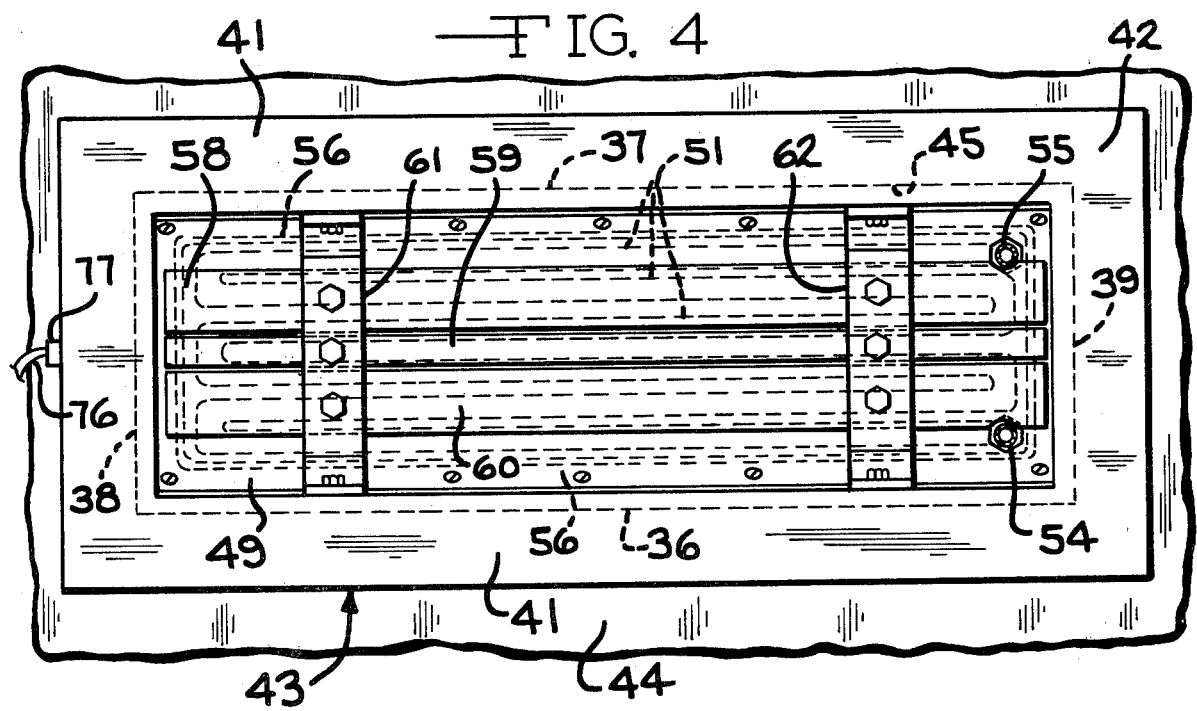
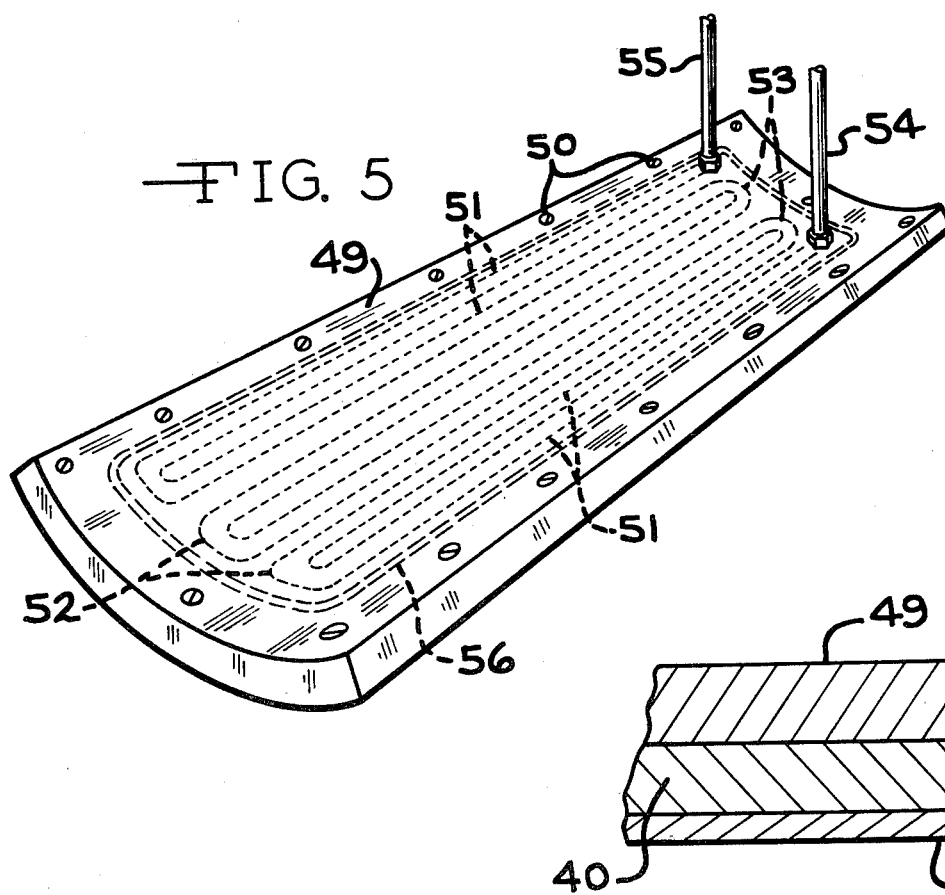
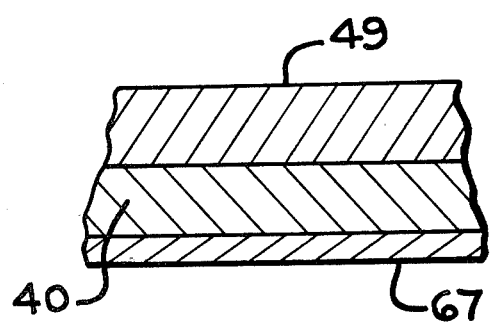

MAGNETRON CATHODE SPUTTERING APPARATUS

BACKGROUND OF THE INVENTION

The present invention relates broadly to apparatus for cathode sputtering and more particularly to an improved magnetron cathode sputtering system.

Cathode sputtering is widely used for depositing thin films of material onto substrates. Such a process involves ion bombarding a flat target plate of the material to be sputtered in an ionized gas atmosphere in an evacuable coating chamber in which a controlled vacuum is maintained to cause particles of the target plate material to be dislodged and deposited as a thin film on the substrate being coated. The target plate, to which a layer of the coating material to be sputtered is applied, is generally of elongated, rectangular form, with the substrate to be coated being moved either continuously or intermittently therebeneath. The longitudinal axis of the target plate is transverse to the direction of substrate movement.

In an endeavor to attain increased deposition rates the use of magnetic enhanced cathodes has been proposed. Such cathodes are known as planar magnetron cathodes and customarily include an array of permanent magnets arranged in a closed loop and mounted in a fixed position in relation to the flat target plate. Thus, the magnetic field is caused to travel in a closed loop, commonly referred to as a "race track" which provides the path or region along which sputtering or erosion of the target plate material takes place.

One drawback of the convential flat plate target, however, is that the race track along which sputtering takes place is relatively narrow so that erosion occurs in a relatively narrow ring-shaped region corresponding to the shape of the closed loop magnetic field. As a result, only a relatively small portion of the total target material in the so-called race track region is consumed before the target must be replaced.

SUMMARY OF THE INVENTION

The present invention contemplates a new and novel form of magnetron cathode which is significantly different from the planar magnetron cathodes heretofore proposed and which, while retaining the advantages of high deposition rates, also renders possible an even more effective and maximum utilization of the target material thereby substantially increasing the operating life thereof.

According to the invention, the cathode assembly is mounted in the upper portion of the coating chamber and comprises an elongated substantially U-shaped support member provided with a concavo-convex bottom wall. Magnetic means, mounted in the support member, includes an array of permanent magnets extending lengthwise thereof opposite said bottom wall to provide a magnetic field which establishes the zone or region in which sputtering of the target material takes place.

The target comprises a replaceable continuous band or foil formed of the material to be sputtered. The foil is mounted on a take-off or feed roll at one side of the cathode and is fed across said support member in contact with the convex surface of the bottom wall thereof and wound onto a take-up roll at the opposite side thereof. The substrates, such as glass sheets, to be coated are horizontally supported and carried beneath the cathode to receive the coating material sputtered from the foil on successive portions thereof. Means is also provided for maintaining the requisite cooling of the cathode assembly.

These and other features and advantages of the invention will become apparent from the following description, with reference to the accompanying drawings.

BRIEF DESCRIPTION OF THE DRAWINGS

FIG. 1 is a vertical longitudinal section through one form of sputter-coating apparatus with which the present invention may be employed, FIG. 2 is a transverse section of the improved magnetron cathode assembly constructed in accordance with the invention, FIG. 3 is a side view taken along line 3—3 of FIG. 2, FIG. 4 is a plan view, FIG. 5 is a perspective view of the cooling plate, and FIG. 6 is a detail section taken substantially on line 6—6 of FIG. 3.

DESCRIPTION OF THE PREFERRED EMBODIMENT

Referring to the drawings, there is illustrated in FIG. 1, one type of continuous apparatus for sputter-coating substrates in which the improved magnetron cathode of this invention may be incorporated.

The apparatus is compared of four successive continuous enclosures which define four independently controlled rectangular chambers—an entry chamber 10, a heating and cleaning chamber 11, a coating chamber 12 and an exit chamber 13. The outer end wall 14 of the entry chamber 10 is provided with an entrance opening 15, while the outer end wall 16 of exit chamber 13 is provided with a discharge opening 17. The chambers are also separated by partition walls 18, 19 and 20 provided with similar openings 21, 22 and 23 respectively. Preferably, quick-opening and closing vacuum-tight closures are provided over at least some of the elongated openings to reduce the vacuum pumping requirements.

Each of the chambers is provided with an outlet tube 24, communicating with a vacuum pump (not shown) and a valve 25 is provided on each said tube to control the pressure within each of the chambers. An inlet tube 26, controlled by valve 27, extends through the top of the coating chamber and communicates with an inert gas source, preferably argon.

Suitably driven conveyor rollers 28 are located in the lower portion of all of the chambers to transport the glass sheets or other substrates 29 to be coated through the sequence of chambers.

Heating means 30 are mounted in the upper portion of the chamber 11 and a reflector 31, mounted above the heating means, is used to concentrate the heat on the passing substrates 29 to attain additional surface cleaning and improved adhesion. A glow-discharge cleaning electrode 32 is located at the top of chamber 11. Shields 33 are positioned below the electrode to prevent the substrates from "seeing" the electrode as they pass through the chamber.

The improved magnetron cathode assembly of this invention is mounted in the upper portion of the coating chamber 12 and is designated in its entirety by the numeral 34. More particularly, the cathode comprises an elongated substantially U-shaped support member 35 formed of vertical side walls 36 and 37, end walls 38 and 39 and a concavo-convex bottom wall 40 secured, as by welding, to the bottom edges of the side and end walls.

The upper edge portions of the side walls and end walls are turned outwardly to provide flanges 41 and 42 respectively which constitute a continuous rim 43. The top wall 44 of coating chamber 12 is provided with an opening 45 and the support member 35 is lowered therethrough until it is supported on the top wall of the chamber by the rim 43. Interposed between the supporting rim and top wall of the coating chamber is a strip of insulating material 46 and O-rings 47 and 48 for sealing the interior of the coating chamber from the atmosphere.

To provide for the required cooling of the cathode there is supported on the bottom wall 40 of the support member 35 a cooling plate 49 which is shaped to conform to the curvature of said bottom wall and secured thereto by screws 50. The bottom surface of the cooling plate 49 is provided with a series of spaced parallel grooves 51 which extend lengthwise of the plate and are connected at alternate ends by the grooves 52 and 53, as best shown in FIG. 5. When the cooling plate 49 is secured to the bottom wall of the support member by the screws 50 there results a serpentine passageway or channel through which a cooling medium, such as water, is circulated. The cooling medium is introduced into the passageway at one end thereof through an inlet pipe 54 and discharged at the opposite end through an outlet pipe 55. An O-ring 56 provides a water tight seal around the cooling plate. Cooling of the cathode is necessary to maintain the temperature thereof within commercially acceptacle limits over a relatively wide range of operating conditions.

Mounted within the support member 35 in close proximity to the cooling plate 49 and intermediate the side walls 36 and 37 of said support member are the magnetic means 57 which consists of the three rows of permanent magnetic bars 58, 59 and 60, arranged closely adjacent and parallel with one another. The bars may be continuous bars that extend lengthwise of the support member or a plurality of relatively short bar sections arranged end to end. The outer magnetic bars 58 and 60 are north poles, while the middle bar 59 is a south pole.

The magnetic bars 58, 59 and 60 are herein shown as supported by the non-magnetic straps 61 and 62 extending transversely thereof and secured thereto by screws 63. The straps are carried at their opposite ends by L-shaped brackets 64 welded to said straps and secured to the side walls 36 and 37 of the support member by screws 66. The magnetic bars serve to provide a magnetic field that defines the zone or region in which sputtering of the target material occurs.

The target consists of a continuous band or foil 67 formed of the material to be sputtered. The foil may be, for example, of aluminum, gold, nickel or platinum, or any other appropriate metal or metal alloy. The foil is in reel form and is mounted on a feed roll 68 located at one side of the support member. In operation, the foil is drawn across the bottom wall 40 of the support member in contact with the convex surface thereof and then wound onto a take-up roll 69 at the opposite side of said support member. The foil is guided during its movement by the guide rolls 70 and 71. The feed roll 68 is carried at its opposite ends by trunnions 72 and 73 which pass through the respective end walls 38 and 39 of the support member and are mounted in bearing brackets 74 and 75.

The planar substrates 29 to be coated are supported horizontally on the conveyor rolls 28 and are carried forwardly beneath the cathode. Simultaneously, the foil 67 of coating material is drawn forwardly beneath and in contact with the support member by the take-up roll 69 on which it is wound. As the substrates pass through the sputter zone provided by the magnetic field, coating material will be sputtered from the foil onto successive portions of the substrates. When the coating material has been depleted, the used foil may be removed and a new reel of foil substituted therefor. The feed roll is preferably provided with a suitable foil tensioning device, while the rotation of the take-up roll can be controlled in different ways, such as by a stepping motor.

A cathode potential sufficient to cause sputtering to occur may be supplied to the cathode from a D.C. power source (not shown) through a power line 76 connected to the support member 35 as indicated at 77. The apparatus is grounded in any suitable manner.

Other objects and advantages of the invention will become apparent from the foregoing description taken in connection with the accompanying drawings.

I claim:

1. In apparatus for sputtering thin films of a coating material upon substantially planar substrates, an evacuable coating chamber, an elongated cathode mounted in said chamber transversely thereof and having a bottom wall provided with a convex outer surface, magnetic means located in said cathode opposite said bottom wall for providing a sputter zone of defined width extending lengthwise of said cathode, a continuous replaceable foil of the coating material to be sputtered mounted in the coating chamber and adapted to be drawn across said cathode in contact with the convex outer surface of the bottom wall thereof for sputtering as it passes through the sputter zone, and means for transporting substantially planar substrates horizontally beneath said cathode to receive the coating material sputtered from said foil.

2. In apparatus as claimed in claim 1, including a feed roll at one side of the cathode upon which the continuous coating foil is supported, and a take-up roll at the opposite side of said cathode for drawing said foil from said feed roll across said cathode in contact with the bottom wall thereof.

3. In apparatus as claimed in claim 1, in which said magnetic means comprises permanent magnets.

4. In apparatus as claimed in claim 1, including means for cooling the bottom wall of the cathode.

5. In apparatus as claimed in claim 1, including a cooling plate shaped to conform to the inner surface of the bottom wall and secured thereto, and means for circulating a cooling medium between said bottom wall and said cooling plate.

6. In apparatus as claimed in claim 5, in which the cooling plate is provided with a serpentine passageway on the surface thereof facing the bottom wall of the cathode, and in which the cooling medium is circulated through said passageway.

7. In apparatus as claimed in claim 1, in which the bottom wall of the cathode is concavo-convex, with the convex surface thereof facing outwardly, a concavo-convex cooling plate secured to the inner concave surface of said bottom wall, and in which a serpentine passageway is provided between said cooling plate and said bottom wall for receiving a cooling medium.

8. A method of sputtering thin films of a selected coating material upon substantially planar substrates in which there is provided a fixed elongated cathode member having a convex surface, establishing in back of said surface a magnetic field providing an erosion pattern on a target consisting of a continuous foil of the material to be sputtered, drawing said continuous foil across and in contact with said convex surface, and passing beneath said foil target the substrates to receive the coating material sputtered from said foil.

* * * * *